(12) United States Patent
Kong et al.

(10) Patent No.: US 10,973,116 B2
(45) Date of Patent: Apr. 6, 2021

(54) 3D HIGH-INDUCTIVE GROUND PLANE FOR CROSSTALK REDUCTION

(71) Applicant: Intel Corporation, Santa Clara, CA (US)

(72) Inventors: Jackson Chung Peng Kong, Tanjung Tokong (MY); Bok Eng Cheah, Bayan Lepas (MY); Khang Choong Yong, Puchong (MY); Ramaswamy Parthasarathy, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/328,535

(22) PCT Filed: Aug. 29, 2017

(86) PCT No.: PCT/US2017/049222
§ 371 (c)(1),
(2) Date: Feb. 26, 2019

(87) PCT Pub. No.: WO2018/063684
PCT Pub. Date: Apr. 5, 2018

(65) Prior Publication Data
US 2019/0208620 A1    Jul. 4, 2019

(30) Foreign Application Priority Data

Sep. 30, 2016   (IN) .............................. 201641033433

(51) Int. Cl.
*H05K 1/02*    (2006.01)
*H05K 1/03*    (2006.01)
(Continued)

(52) U.S. Cl.
CPC ......... *H05K 1/0222* (2013.01); *H05K 1/0219* (2013.01); *H05K 1/0224* (2013.01);
(Continued)

(58) Field of Classification Search
CPC ... H05K 1/02; H05K 1/03; H05K 1/11; H05K 1/18; H05K 3/00; H05K 3/10; H05K 3/46;
(Continued)

(56) References Cited

U.S. PATENT DOCUMENTS 5,952,709 A * 9/1999 Kitazawa ............. H05K 1/0243
257/275
6,057,600 A * 5/2000 Kitazawa ................ H01L 23/66
257/691
(Continued)

FOREIGN PATENT DOCUMENTS

WO    WO-2016-039740    3/2016

OTHER PUBLICATIONS

International Preliminary Report on Patentability for International Patent Application No. PCT/US2017/049222, dated Apr. 11, 2019, 9 pgs.
(Continued)

*Primary Examiner* — Xiaoliang Chen
(74) *Attorney, Agent, or Firm* — Schwabe, Williamson & Wyatt, P.C.

(57) ABSTRACT

Embodiments are generally directed to 3D high-inductive ground plane for crosstalk reduction. An embodiment of a printed circuit board includes a first signal trace and a second signal trace on a first layer, wherein the first signal trace and second signal trace are non-intersecting; a second layer below the first layer; a third layer below the second layer; and a three-dimensional (3D) ground plane, the 3D ground plane including a first plurality of segments on the third layer, a second plurality of segments on the second layer, and a plurality of metal vias to connect the first plurality of segments and the second plurality of segments in the ground plane.

14 Claims, 12 Drawing Sheets

(51) Int. Cl.
  *H05K 1/11* (2006.01)
  *H05K 1/18* (2006.01)
  *H05K 3/00* (2006.01)
  *H05K 3/10* (2006.01)
  *H05K 3/46* (2006.01)
  *H01P 3/00* (2006.01)
  *H01P 3/08* (2006.01)
  *H03H 7/38* (2006.01)
  *H03H 7/42* (2006.01)

(52) U.S. Cl.
  CPC ............... *H05K 2201/0707* (2013.01); *H05K 2201/09672* (2013.01)

(58) Field of Classification Search
  CPC .... H01P 3/00; H01P 3/08; H03H 7/38; H03H 7/42
  USPC ....... 174/262, 250, 251, 255, 260, 261, 266; 333/1, 25, 26, 33, 193, 238, 260; 361/126, 306.3, 753, 783; 257/664, 728, 257/738, 774
  See application file for complete search history.

(56) References Cited

U.S. PATENT DOCUMENTS

| | | | | |
|---|---|---|---|---|
| 6,239,669 | B1* | 5/2001 | Koriyama | H01L 23/66 333/247 |
| 7,298,231 | B2* | 11/2007 | Ikuta | H03H 9/725 333/133 |
| 7,696,628 | B2* | 4/2010 | Ikeuchi | H01P 1/047 257/775 |
| 8,841,561 | B1* | 9/2014 | Jiang | H05K 1/0219 174/262 |
| 10,453,803 | B2* | 10/2019 | Wang | H01L 23/5383 |
| 2001/0013654 | A1* | 8/2001 | Kalidas | H01L 23/49816 257/738 |
| 2002/0176236 | A1* | 11/2002 | Iguchi | H05K 1/0216 361/753 |
| 2002/0181185 | A1* | 12/2002 | Kabumoto | H01L 23/49822 361/306.3 |
| 2004/0093577 | A1* | 5/2004 | Amrilio | H01L 21/76892 326/41 |
| 2005/0174190 | A1* | 8/2005 | Yagyu | H01P 5/08 333/33 |
| 2006/0011384 | A1* | 1/2006 | Kwong | H05K 1/0221 174/260 |
| 2006/0158280 | A1* | 7/2006 | Jow | H01L 23/66 333/33 |
| 2006/0255876 | A1* | 11/2006 | Kushta | H01P 3/06 333/33 |
| 2007/0057745 | A1* | 3/2007 | Ilkov | H01F 17/0013 333/25 |
| 2009/0029570 | A1* | 1/2009 | Ikeuchi | H01P 1/047 439/67 |
| 2009/0237855 | A1* | 9/2009 | Shrier | H01C 7/10 361/126 |
| 2010/0244274 | A1* | 9/2010 | Ishitsuka | H01L 23/498 257/774 |
| 2011/0037528 | A1* | 2/2011 | Guo | H01L 23/49822 333/1 |
| 2012/0079238 | A1* | 3/2012 | Betsui | G11C 5/04 712/32 |
| 2013/0215588 | A1* | 8/2013 | Kawai | H05K 1/0298 361/783 |
| 2014/0104802 | A1* | 4/2014 | Oikawa | H05K 1/18 361/783 |
| 2014/0176254 | A1* | 6/2014 | Iida | H01P 3/08 333/33 |
| 2014/0184360 | A1* | 7/2014 | Kato | H05K 1/0253 333/238 |
| 2014/0262448 | A1* | 9/2014 | Kato | H05K 1/0253 174/251 |
| 2014/0264907 | A1* | 9/2014 | Altunyurt | H01L 23/5226 257/774 |
| 2015/0013155 | A1* | 1/2015 | Kim | H05K 1/0222 29/846 |
| 2015/0042421 | A1* | 2/2015 | Kato | H01P 3/085 333/238 |
| 2016/0156087 | A1* | 6/2016 | Baba | H01P 3/06 333/238 |
| 2017/0150594 | A1* | 5/2017 | Jones | H05K 1/0251 |
| 2017/0286725 | A1* | 10/2017 | Lewis | G06F 21/86 |

OTHER PUBLICATIONS

International Search Report and Written Opinion for International Patent Application No. PCT/US2017/049222 dated Dec. 11, 2017, 12 pgs.

* cited by examiner

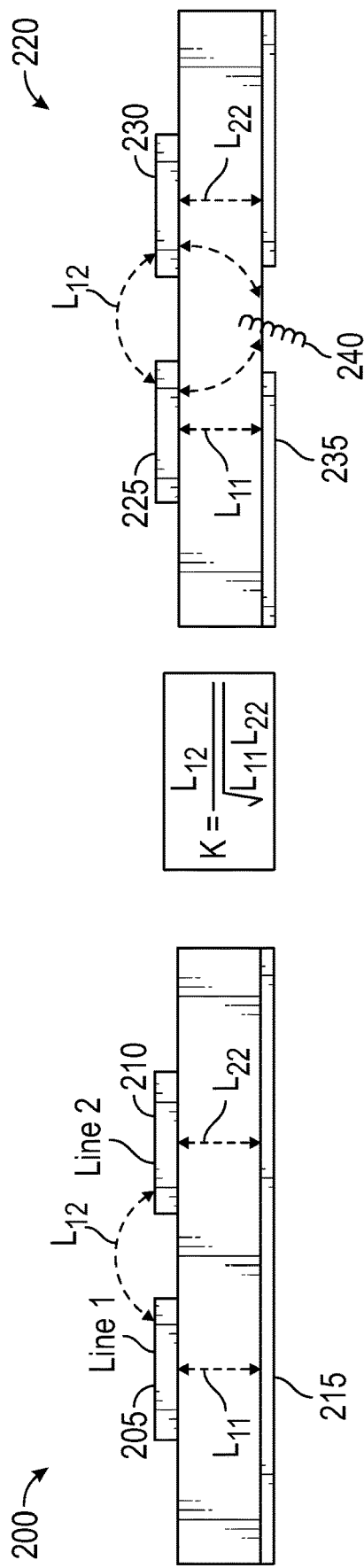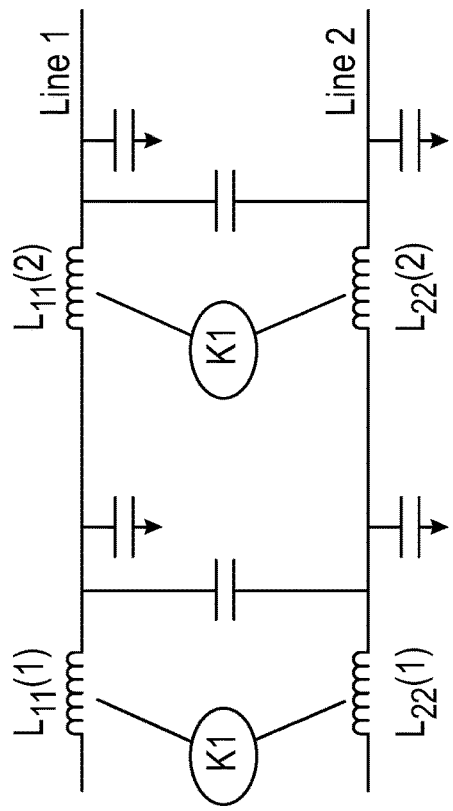
FIG. 2A
FIG. 2B

3D HIGH-INDUCTIVE GROUND PLANE FOR CROSSTALK REDUCTION

CROSS-REFERENCE TO RELATED APPLICATIONS

This is a U.S. National Phase Application under 35 U.S.C. § 371 of International Application No. PCT/US2017/049222, filed Aug. 29, 2017, entitled "3D HIGH-INDUCTIVE GROUND PLANE FOR CROSSTALK REDUCTION," which designates the United States of America, which claims priority to India Patent Application No. 201641033433, filed Sep. 30, 2016, entitled "3D HIGH-INDUCTIVE GROUND PLANE FOR CROSSTALK REDUCTION", the entire disclosure of which are hereby incorporated by reference in their entirety and for all purposes.

TECHNICAL FIELD

Embodiments described herein generally relate to the field of electronic devices and, more particularly, a 3D high-inductive ground plane for crosstalk reduction.

BACKGROUND

In the operation of electronic devices, which are continuing to be reduced in size while also being operated at higher speeds, crosstalk noise is an increasing problem. In particular, far-end crosstalk is generally associated with microstrip (MS) routing configuration in printed circuit board (PCB) design. Far-end crosstalk (FEXT) refers to interference at a far end of a circuit, while near-end crosstalk (NEXT) refers to crosstalk at a near-end of the circuit.

As signaling speed increases with every new generation of high-speed input/output (I/O) interfaces, crosstalk noise has become an increasingly significant factor in constraining the physical aspects of PCB design, such as shorter lengths that are supportable and additional PCB layer counts.

Conventional solutions to mitigate FEXT include allocating more lane-to-lane spacing to minimize crosstalk coupled from one signal lane to adjacent one. However, the drawback of the conventional approach is that more PCB real estate is needed, thus requiring a larger system form-factor, and thus interfering with miniaturization efforts.

BRIEF DESCRIPTION OF THE DRAWINGS

Embodiments described here are illustrated by way of example, and not by way of limitation, in the figures of the accompanying drawings in which like reference numerals refer to similar elements.

FIG. 2A illustrates inductive coupling in signal line structures and FIG. 2B an equivalent circuit crosstalk model for the signal line structures;

DETAILED DESCRIPTION

Embodiments described herein are generally directed to a 3D high-inductive ground plane for crosstalk reduction.

For the purposes of this description, the following apply:

"Crosstalk" refers to a signal on one signal channel causing an undesired effect on another signal channel due to inductive coupling or capacitive coupling between such channels. Far-end crosstalk (FEXT) refers to interference at a far end of a circuit, while near-end crosstalk (NEXT) refers to crosstalk at a near-end of the circuit.

Conventional solutions to mitigate far-end crosstalk on PCB signal traces include allocating more lane-to-lane spacing to minimize crosstalk coupled from one signal lane to an adjacent signal. However, the drawback to increasing signal line spacing is an increase in the amount of PCB real estate needed, thus requiring a larger system form-factor.

Alternatively, instead of using microstrip routing, a system may utilize stripline (SL) or dual-stripline (DSL) routing, wherein signal routes are located at the inner layers of PCB. However, this translates to an increase in layer counts, which thus results in an increase in Z-height for an electronic device such as a computing device, which thus further limit the overall system design in that may be achieved in technologies such as in 2-in-1 computing systems.

In some embodiments, an apparatus, system, or process provides for 3D high-inductive ground planes for crosstalk reduction. In some embodiments, the 3D ground plane provides an electromagnetic absorbing ground plane structure including alternating segments on multiple planes, the alternating segments being connected by vias. The ground plane thus is three-dimensional in that it exists on multiple planes or layers in a PCB. In some embodiments, each segment is separated by a gap from a next segment on the same plane. In some embodiments, the ground plane structure is provided for crosstalk reduction in applications including multi-Gbps (gigabits per second) implementations.

Figure 1A:
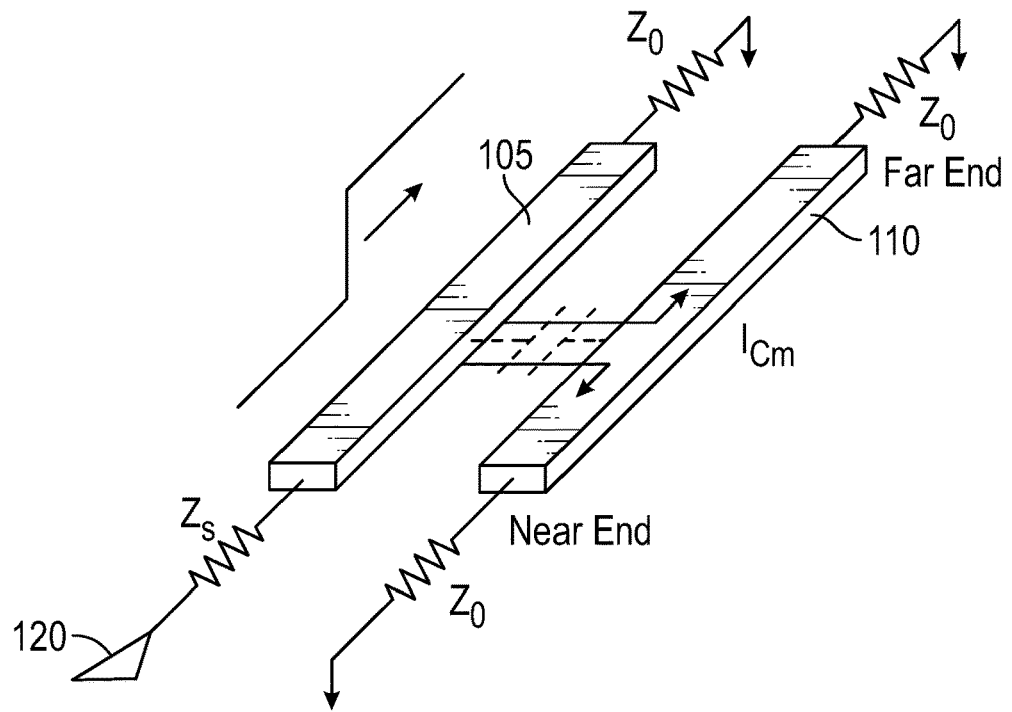
FIGS. 1A and 1B are illustrations of coupled currents on a victim line sum to produce near-end and far-end crosstalk noise.
Figure 1B:
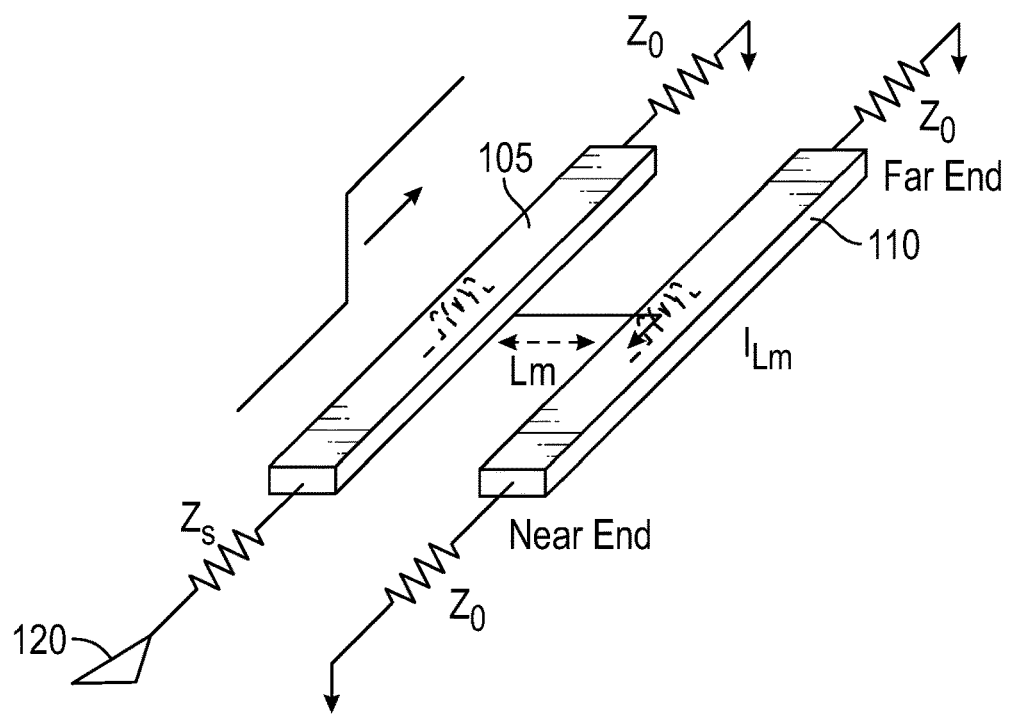

FIGS. 1A and 1B are illustrations of coupled currents on a victim line sum to produce near-end and far-end crosstalk noise. FIGS. 1A and 1B illustrate the formation of coupled currents and thus crosstalk between two adjacent signal lines, the coupled lines being illustrated as a first signal line 105 (commonly referred to as the aggressor line) with driver 120 driving a signal, and a coupled second line 110 (commonly referred to as the victim line) receiving crosstalk. In general the first signal line and second signal line are non-intersecting lines, and may be parallel with each other at least in part The induced current and voltage are the following:

$$I_{Cm} = C_m \frac{dV}{dt} \quad [1]$$

$$V_{Lm} = L_m \frac{dI}{dt} \quad [2]$$

Further, the current totals for the near end and far end are the following:

$$I_{near} = I_{Cm} + I_{Lm} \quad [3]$$

$$I_{far} = I_{Cm} + I_{Lm} \quad [4]$$

The crosstalk noise is largely ascribed to the electromagnetic fields, the electric field (E) and magnetic field (H), as associated with the mutual capacitance ($C_M$) and inductance ($L_M$) respectively.

It is noted that the coupling current due to $L_M$ is more dominant compared to $C_M$, as inductance is usually in the range of nH (nanohenries, ×10$^{-9}$ magnitude) while capacitance is in the range of pF (picofarads, ×10$^{-12}$) with general PCB stack-up and design. For this reason, embodiments herein are directed to inductance control for reducing FEXT.

FIG. 2A illustrates inductive coupling in signal line structures and FIG. 2B an equivalent circuit crosstalk model for the signal line structures. As illustrated in FIG. 2A, in a first conventional signal line structure 200, the structure having conventional microstrip routing without any intervening structure, there is a first signal line (or lane or trace) 205 and a second signal line 210. In this structure, the mutual inductances are between the lines, $L_{12}$, and the self-inductance between each of the lines 205-210 and the ground plane 215 below, $L_{11}$ (between the first line and the ground plane) and $L_{22}$ (between the second line and the ground plane).

The inductive coupling ratio K is as follows:

$$K = \frac{L_{12}}{\sqrt{L_{11} L_{22}}} \quad [5]$$

Thus, it can be seen that an increase in self-inductance will reduce the inductive coupling ratio. In some embodiments, a 3-dimensional high-inductive ground planes is provided in order to increase the self-inductance of signals, which in turn reduces the inductance coupling ratio K.

As illustrated in FIG. 2A, an embodiment of a second structure 220 includes a first line 225 and a second line 230, with the inductances being the mutual inductance between the lines, $L_{12}$, and the self-inductance between each of the lines 225-230 and the ground plane 235 below, $L_{11}$ (between the first line and the ground plane) and $L_{22}$ (between the second line and the ground plane). In this embodiment, a 3D high-inductive structure is provided in order to produce additional self-inductance, $L_{11}$ and $L_{22}$. In some embodiments, the high-inductive structure is implemented so as to not encroach the area directly below the signal lanes 225-230, as this would alter the E-field between the signal and ground, thus changing the capacitance and characteristic impedance of the signal conductor.

FIG. 2B provides an equivalent circuit to illustrate the inductive coupling ratio K1 between Line 1 and Line 2 including the existing self-inductance values $L_{11}(1)$, $L_{11}(2)$, $L_{22}(1)$ and $L_{22}(2)$ respectively, as then modified by the additional self-inductance generated by the additional high-inductive structure provided in an embodiment.

FIGS. 3A-3F illustrate multiple views of a 3D EM absorbing structure according to an embodiment.

Figure 3A:
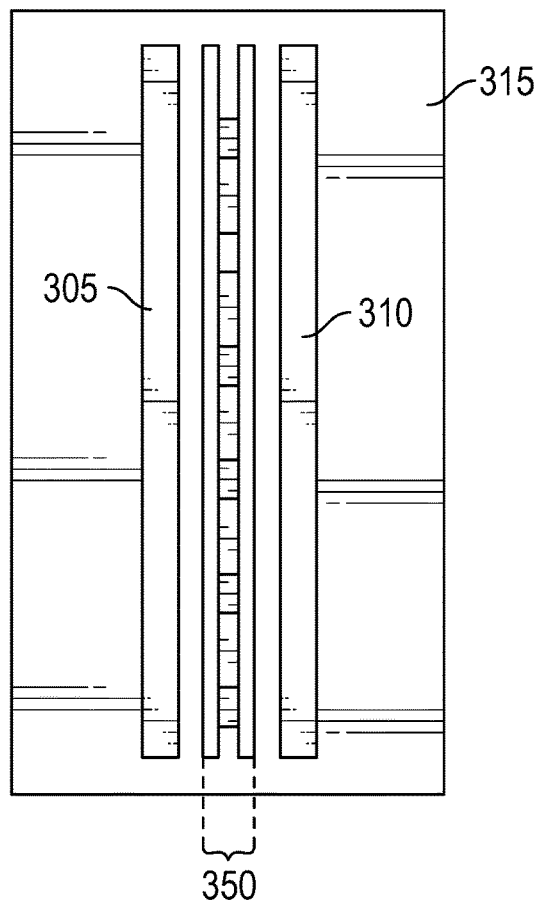
FIGS. 3A-3E illustrate multiple views of a 3D EM absorbing structure according to an embodiment.

FIG. 3A is an illustration of a top view of a device including a high-inductive ground plane structure according to an embodiment. As illustrated, a device 300 includes a pair of parallel signal traces 305 and 310 above a Vss reference plane 315. In some embodiments, a 3D electromagnetic (EM) absorbing structure 350 is constructed between the signal traces 305 (within Vss reference plane 315), the structure providing a 3D high-inductive ground plane for crosstalk reduction between the signal traces 305-310.

Figure 3B:
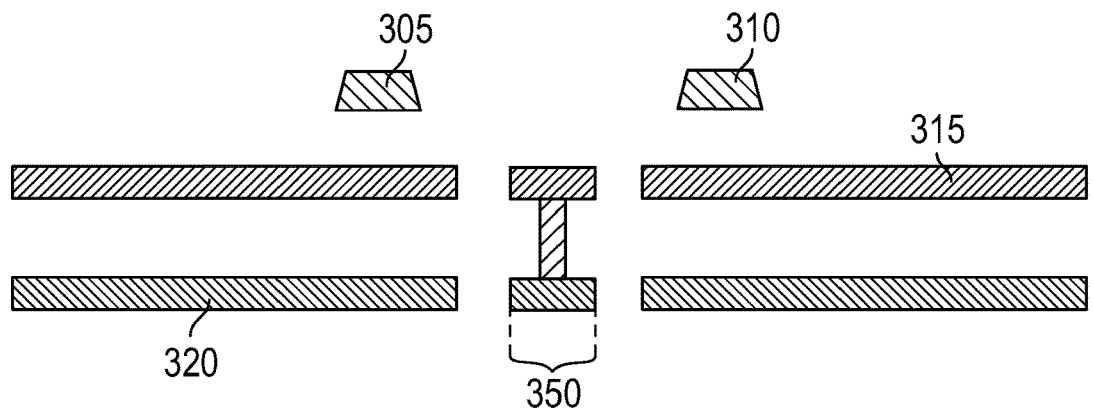

FIG. 3B is an illustration of a cross-section view of the device including a high-inductive ground plane structure according to an embodiment. In this illustration, the signal traces 305 and 310 (viewed in a direction from an end of the signal traces) are shown above the Vss reference plane 315 and a routing layer 320. As illustrated in FIG. 3B, the 3D EM absorbing structure 350 that is associated with a reference voltage, e.g. through Vss reference plane 315, is constructed on multiple planes.

Figure 3C:
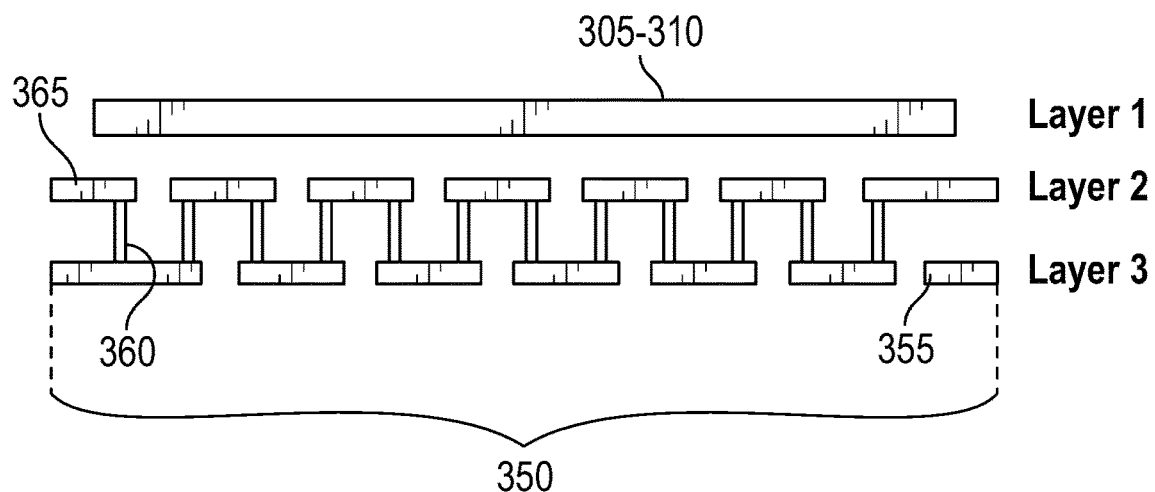

FIG. 3C is an illustration of a side view of the device including a high-inductive ground plane structure according to an embodiment. In this illustration, the signal traces 305 and 310 (viewed in a direction along a side of one of the signal traces) are shown on a first layer (Layer 1) above the 3D EM absorbing structure 350 is constructed on multiple layers, the layers being a Layer 2 (or ground plane layer) below Layer 1 and Layer 3 (or portion of routing layer) below Layer 2. In some embodiments, the EM absorbing structure 350 provides a segmented structure including a first set of segments 355 at Layer 3 and a segmented structure including a second set of segments 365 at Layer 2, wherein each segment of the first set of segments is separated from a next segment on Layer 3 by a gap or space, and each segment of the second set of segments is separated from a next segment on Layer 2 by a gap or space. In some embodiments, a first end and a second end of each segment of the first set of segments is connected by a metal via 360 to an end of a segment of the second set of segments such that the ground plane alternates between Layer 3 and Layer 2, or, stated in another way, creating a square wave pattern for the 3D ground plane along Layer 3 and Layer 2. The first set of segments 355 and the second set of segments 365 are associated with a particular reference voltage e.g. ground (Vss) or power (Vcc) reference plane. In some embodiments, there is a connection between the first set of segments 355 and the second set of segments 365 and the associated reference voltage.

Figure 3D:
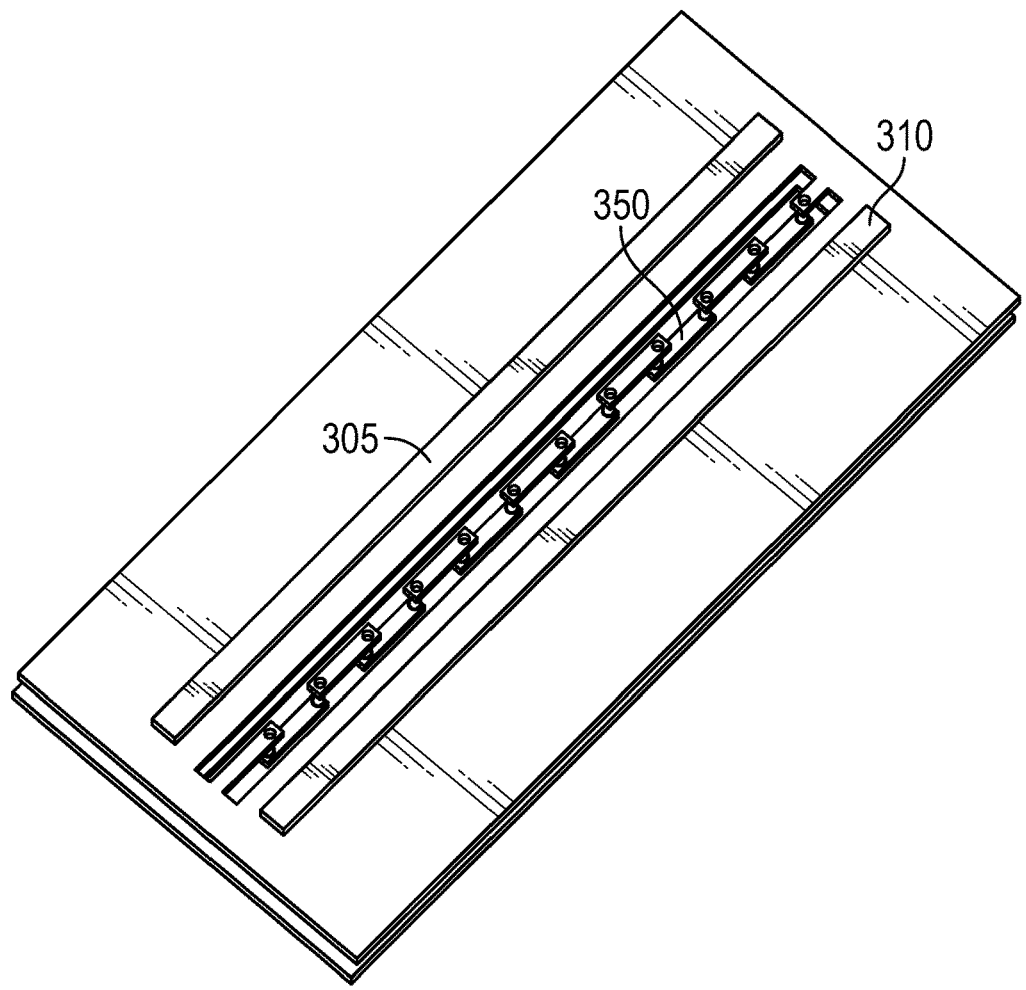

FIG. 3D is an illustration of a first perspective view of the device including a high-inductive ground plane structure according to an embodiment. In this illustration, the signal traces, a first signal trace 305 and a second signal trace 310, are illustrated with the 3D high inductive ground plane 350 being located between the first signal trace 305 and second signal trace 310.

Figure 3E:
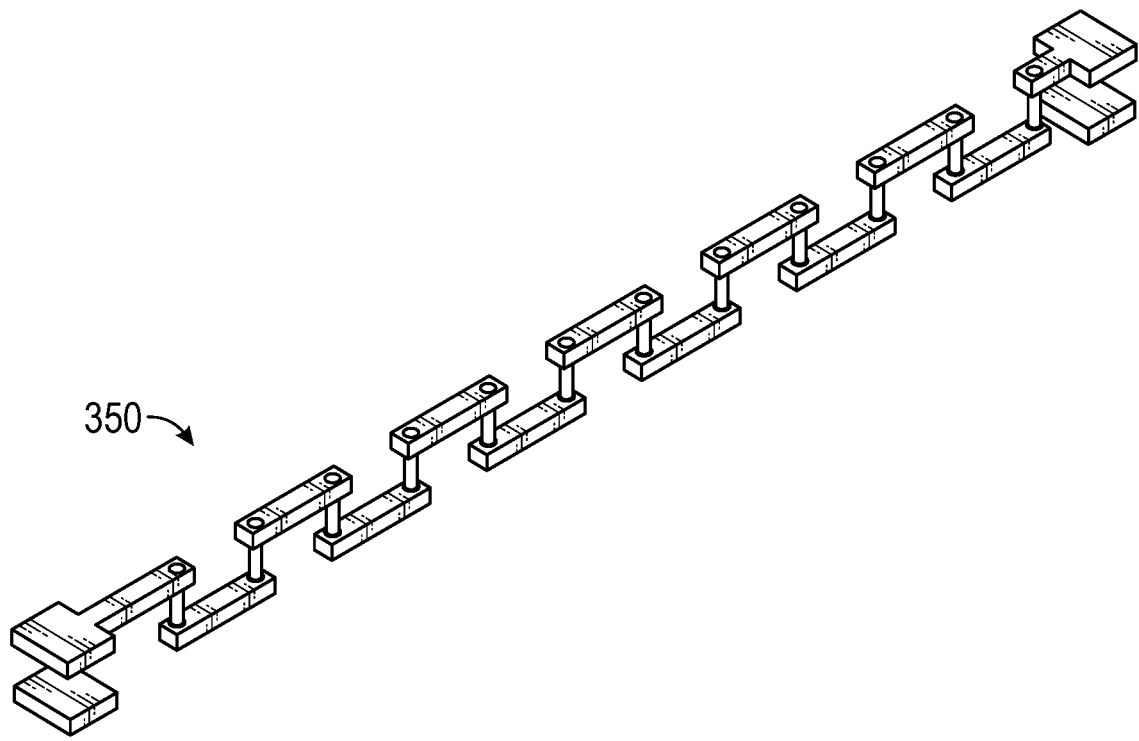

FIG. 3E is an illustration of a first perspective view of the device including a high-inductive ground plane structure according to an embodiment. In this illustration, the signal lanes are hidden such that only the 3D high inductive ground plane 350 is illustrated, the ground plane providing a square wave pattern between the layers of the device.

The three-dimensional high-inductive structure of the ground plane provides separation on multiple layers between the signal lines, while providing additional self-inductance to reduce the inductive coupling ratio for the signal, thereby providing enhanced crosstalk rejection while also enabling closer spacing of signal lines.

Figure 4A:
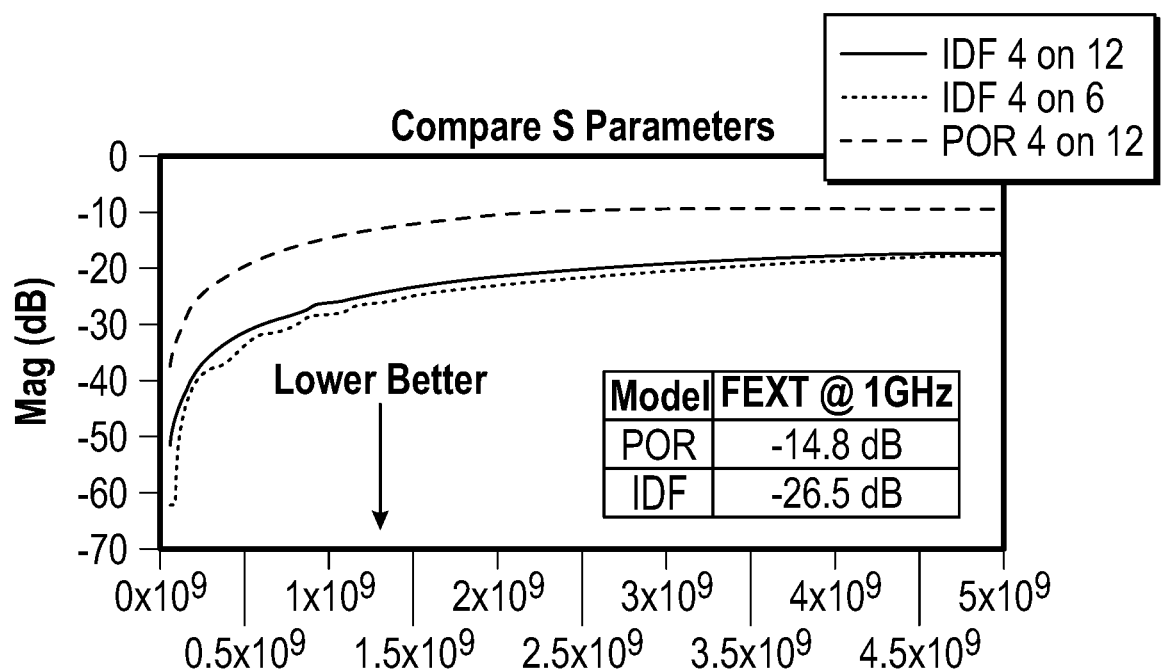
FIGS. 4A and 4B illustrate a comparison of FEXT for signal line structures.
Figure 4B:
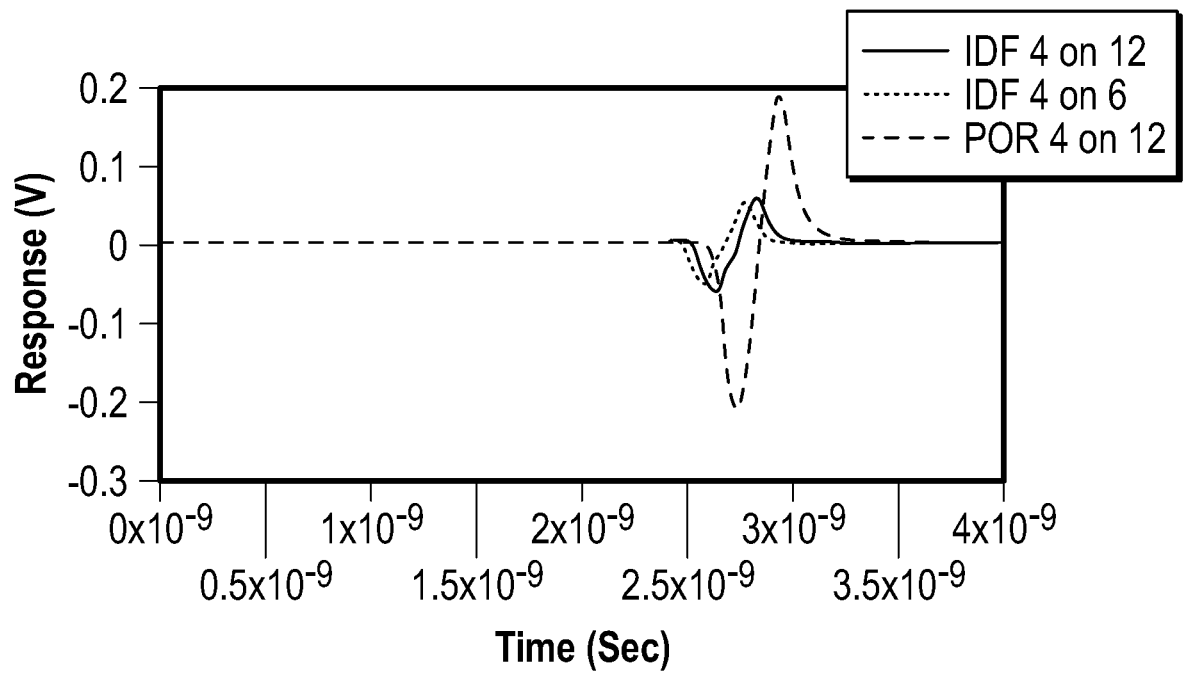

FIGS. 4A and 4B illustrate a comparison of FEXT for signal line structures. In FIGS. 4A and 4B, FEXT for a particular embodiment of a structure with and without a 3D high-inductive ground plane structure is verified from 3D full-wave EM solver with frequency- and time-domains data. FIG. 4A illustrates frequency-domain results and FIG.

4B illustrates time-domains results for FEXT, the results comparing a conventional structure to an embodiment including a 3D high-inductive ground plane, such as illustrated in FIGS. 3A to 3E.

As shown in FIGS. 4A and 4B, the 3D high-inductive ground plane structure provides significant far-end crosstalk (FEXT) improvement, including significant reduction (of approximately 12 dB in a particular implementation, as shown) even with reduced planar spacing between signal lanes. The interconnection structure thus may be utilized for device miniaturization or performance scaling, allowing high-density and speed interconnects design.

From S-parameter frequency domain results (as illustrated in FIG. 4A), FEXT is improved by 12 dB (i.e. from −14.8 dB to −26.5 dB) at 1 GHz. Similar FEXT improvement is valid at high frequency up to 5 GHz. Time-domain results in FIG. 4B show that peak-to-peak FEXT noise may be reduced from 0.4V to 0.12V by utilizing an embodiment including high-inductive ground planes with 10" PCB length, which in this example translates into 70% of noise reduction.

As illustrated by the results shown in FIGS. 4A and 4B, in addition to reduction of crosstalk noise, a further benefit provided by an embodiment is enablement of high-density interconnect design. In the particular example illustrated in FIGS. 4A and 4B, the 3D high-inductive ground planes enables reduction of the line-to-line spacing by half, from 12 mils to 6 mils spacing, while the FEXT performance for the 3D high-inductive ground plane is still significantly improved from a conventional microstrip routing configuration of 4on12 (referring to 4 mils trace width and 12 mils trace spacing). This potential spacing reduction may be particularly beneficial for system designs that are more bounded by X-Y planar real estate, than Z-height requirement.

Figure 5A:
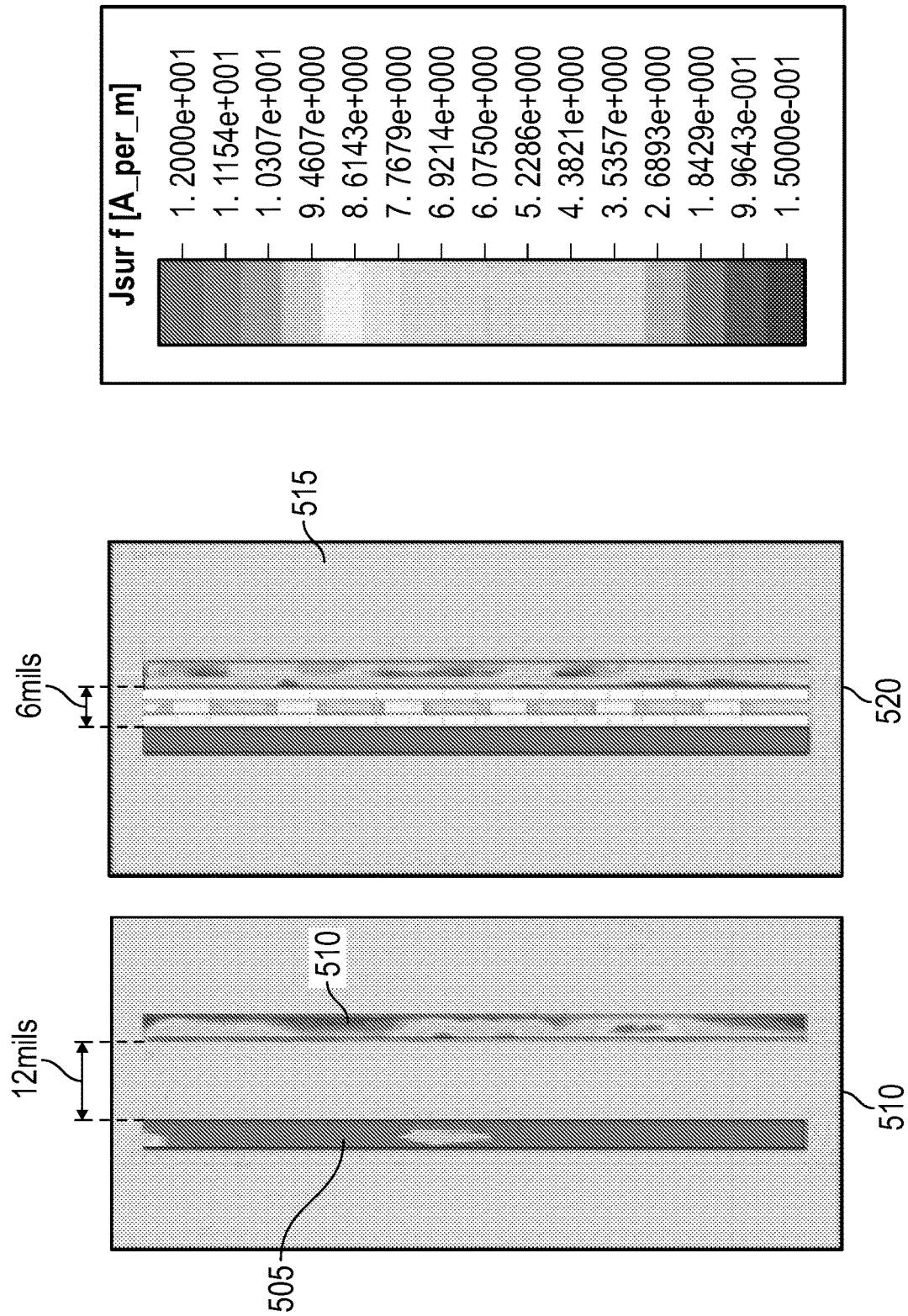
FIG. 5A is an illustration of current density (J) plots for signal line structures.
Figure 5B:
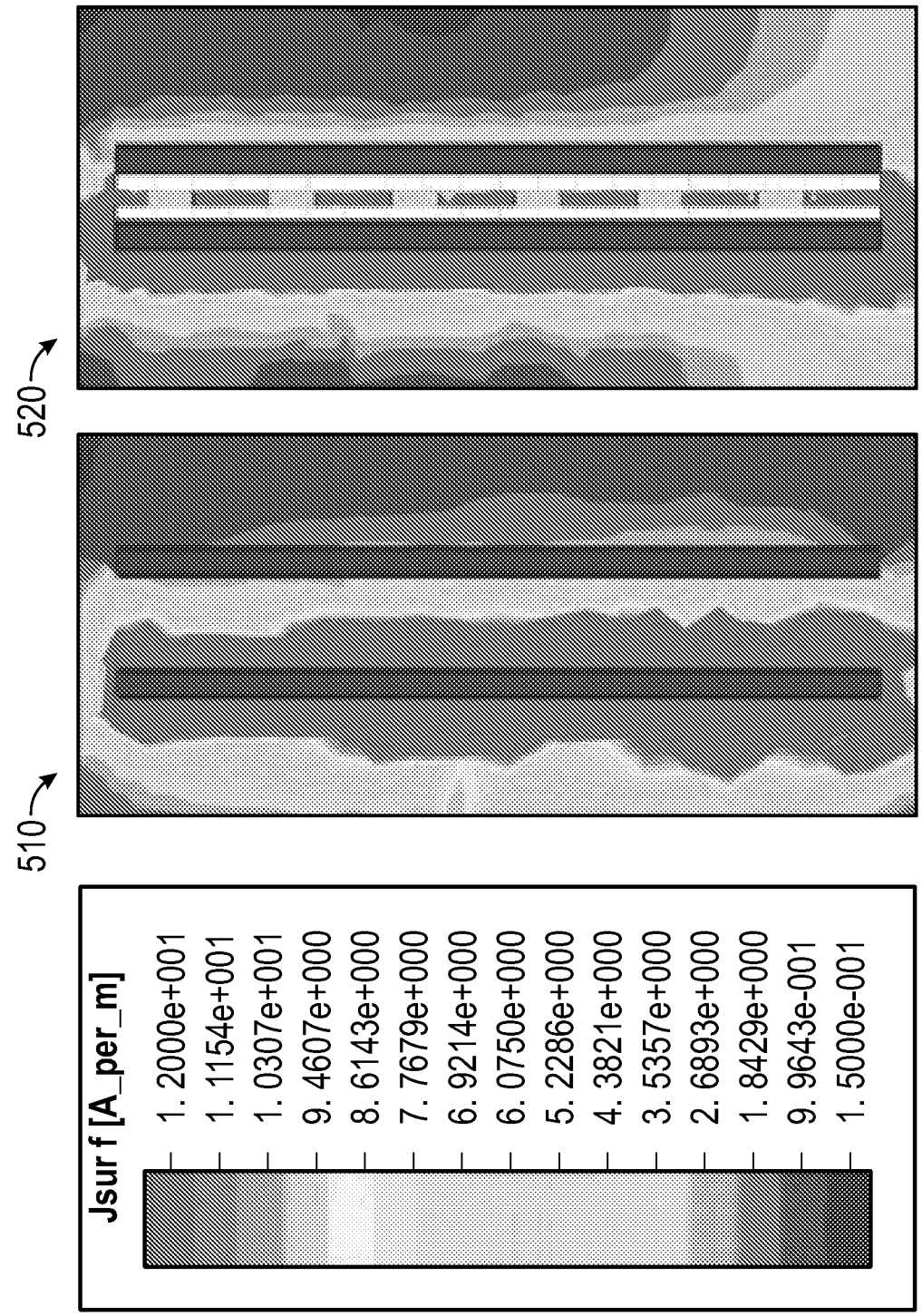
FIG. 5B is an illustration of current density (J) plots for a ground plane structure.

FIG. 5A is an illustration of current density (J) plots for signal line structures, and FIG. 5B is an illustration of current density (J) plots for a ground plane structure. The illustrated current density plots compare a conventional structure without any intervening structure between the signal lines 510 and an embodiment including a 3D high-inductive ground plane between the signal lines 520. The illustrated current density (J) plots illustrate the effectiveness of an embodiment to absorb/attract the H-field from the aggressor signal, while preventing noise to couple to the victim signal.

As seen in FIG. 5A, showing the current density on the signal traces, there are fewer or reduced current density hotspots on the victim lane even with the reduced signal line spacing from 12 mils to 6 mils.

Further, the J-plot on the ground plane provided in FIG. 5B illustrates that the current density is less distributed with the embodiment containing the 3D ground plane. The current density is highly concentrated in areas beneath the aggressor signal and 3D high-inductive area. This indicates less noise coupled to the victim signal, particularly during the signaling return path.

Figure 6A:
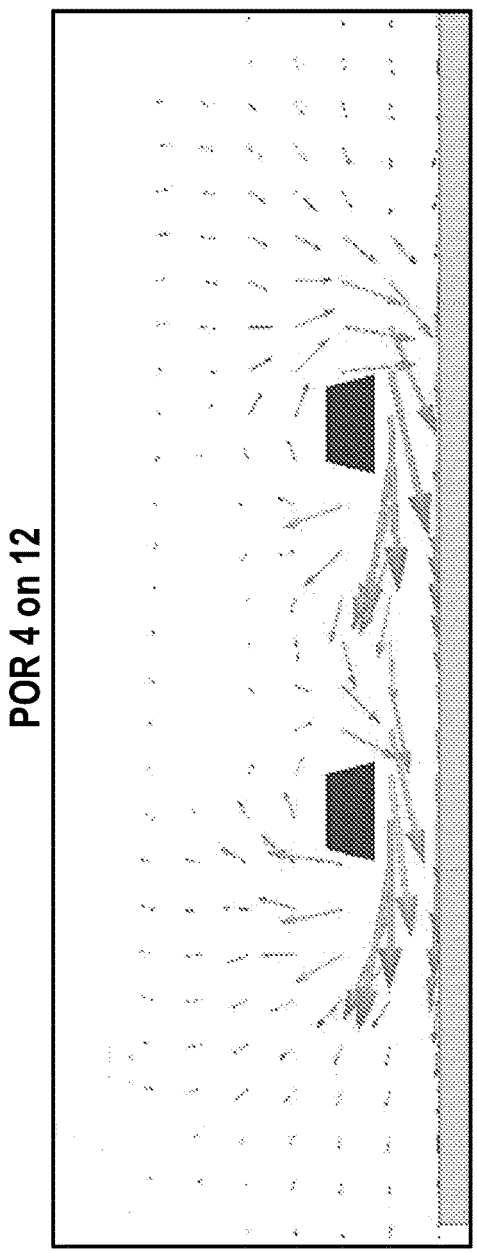
FIGS. 6A and 6B are illustrations of magnetic H-field plots for signal line structures.
Figure 6A:
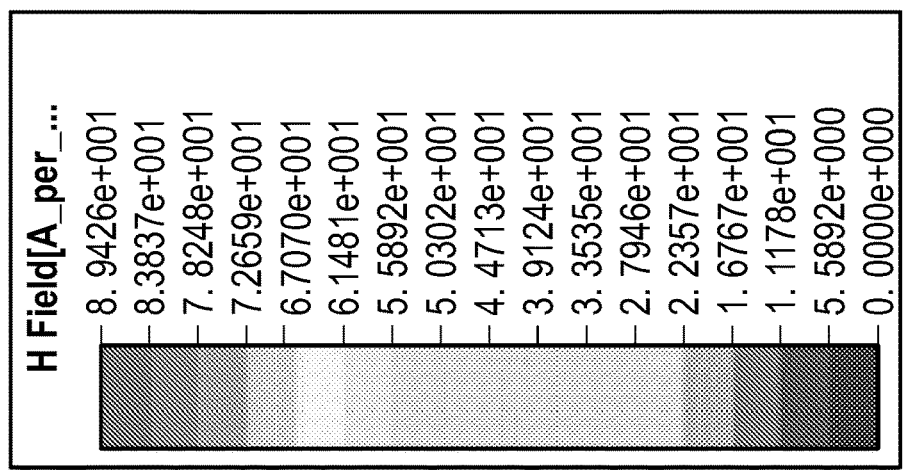
Figure 6B:
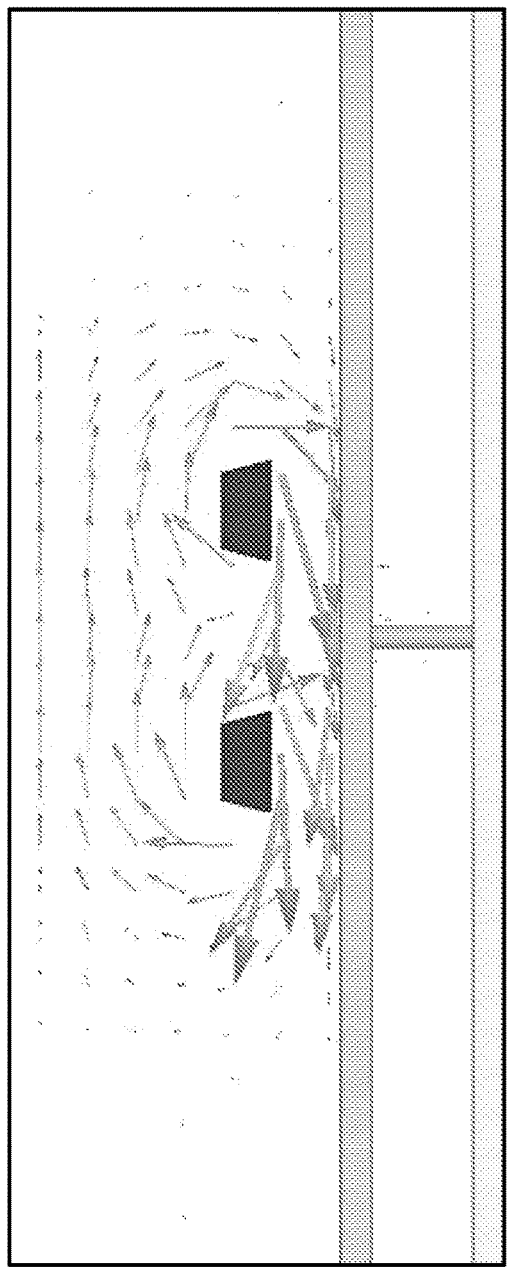
Figure 6B:
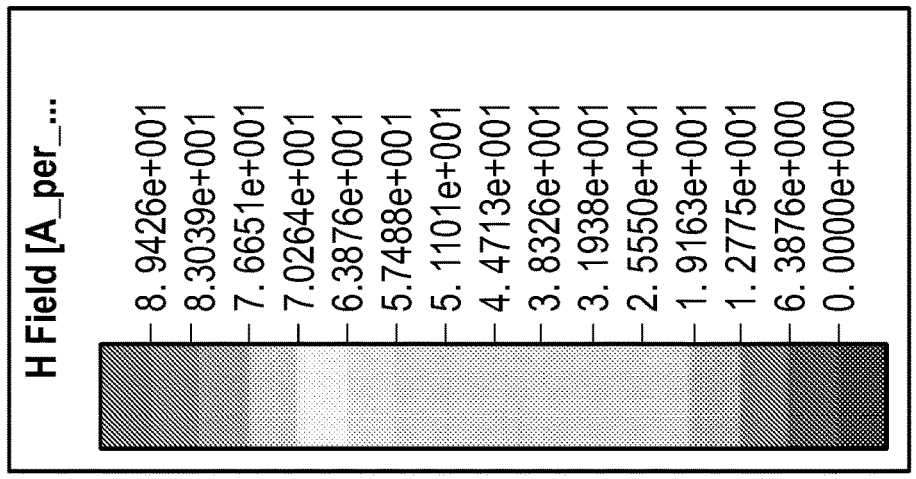

FIGS. 6A and 6B are illustration of magnetic H-field plots for signal line structures. As provided in FIG. 6A for a conventional 4on12 structure and FIG. 6B for an embodiment of a 4on6 structure with 3D high-inductive ground plane, the magnetic H-field plots illustrate how the flux lines are directed to the 3D high-inductive ground plane, thus reducing the mutual inductance coupling between adjacent signal lines. A higher concentration of field lines can be seen to couple between signal lines and ground plane beneath in the embodiment in comparison with the conventional configuration.

Figure 7:
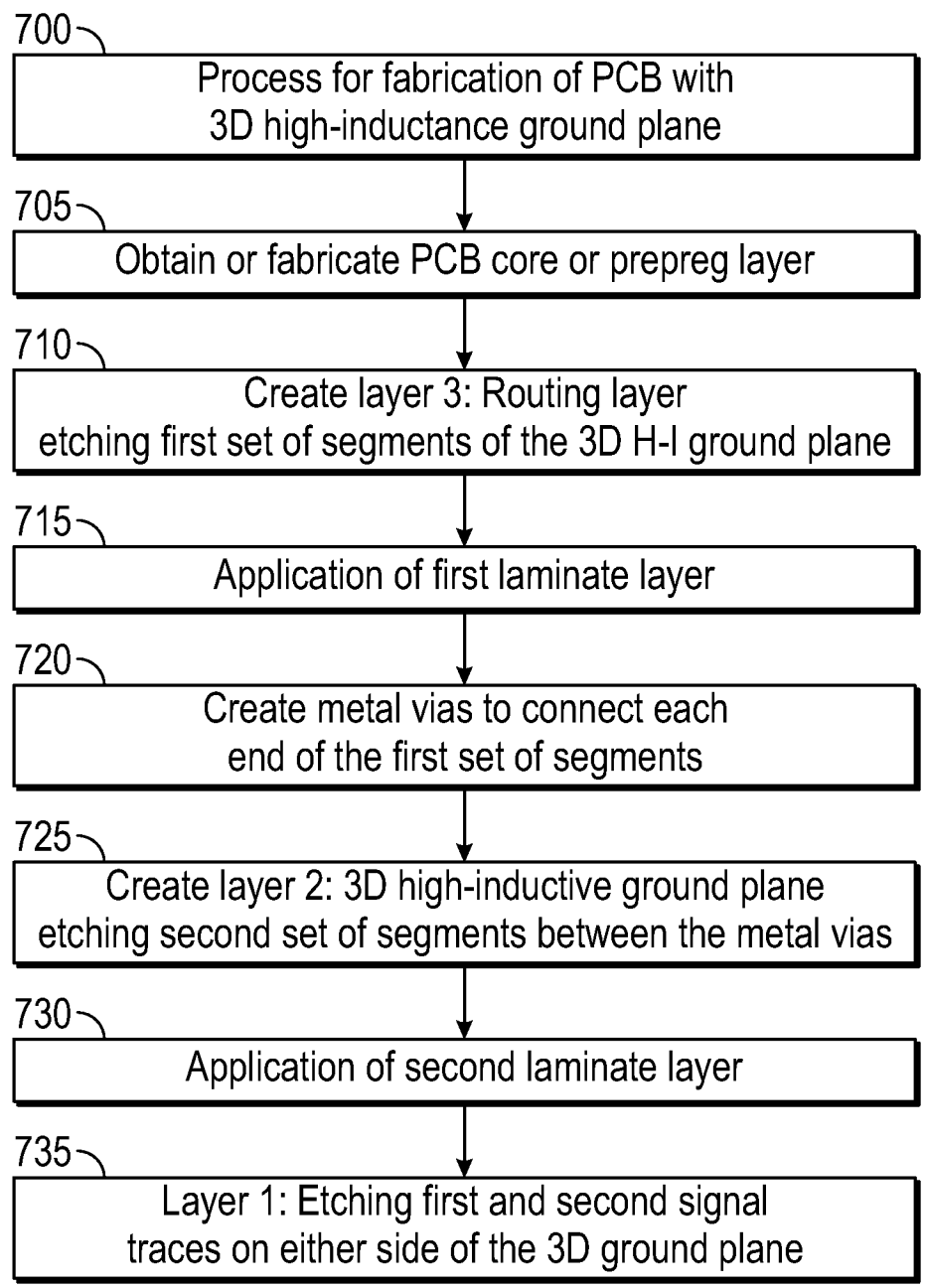
FIG. 7 is an illustration of a process for fabrication of a printed circuit board with 3D high inductance ground plane according to an embodiment.

FIG. 7 is an illustration of a process for fabrication of a printed circuit board with 3D high inductance ground plane according to an embodiment. In some embodiments, a process 700 includes the following:

705: Obtain or fabricate PCB core or prepreg layer example with FR4 epoxy resin based material.

710: Create Layer 3 (using the layer designations provided in FIG. 3C), including creating the routing layer and etching the first set of segments of the 3D high-inductive ground plane through, for example, subtractive metallization process i.e. photo-resist (PR) lamination, development (ultra-violet light) and etching process. In some embodiments, the conductive portion of Layer 3, e.g. copper foil, may be pre-laminated on the PCB core or prepeg layer.

715: Application of first laminate layer, e.g. FR4 or polyimide based dielectric layer, through for example, a hot press process.

720: Create metal vias through the first laminate to connect to each end of the segments of the first set of segments through, for example, a mechanical or laser drilling process.

725: Create Layer 2, including creating the ground plane and etching the second set of segments of the 3D high-inductive ground plane through, for example, subtractive metallization process, wherein the set of segments are created between the metal vias in an alternating fashion to provide a square wave design on Layer 2 and Layer 3.

730: Application of second laminate layer, e.g. FR4 epoxy resin or polyimide based dielectric layer, through, for example, a hot press process.

735: Create Layer 1, including etching the first and second signal traces on either side of the 3D high-inductive ground plane through example subtractive metallization process.

Figure 8:
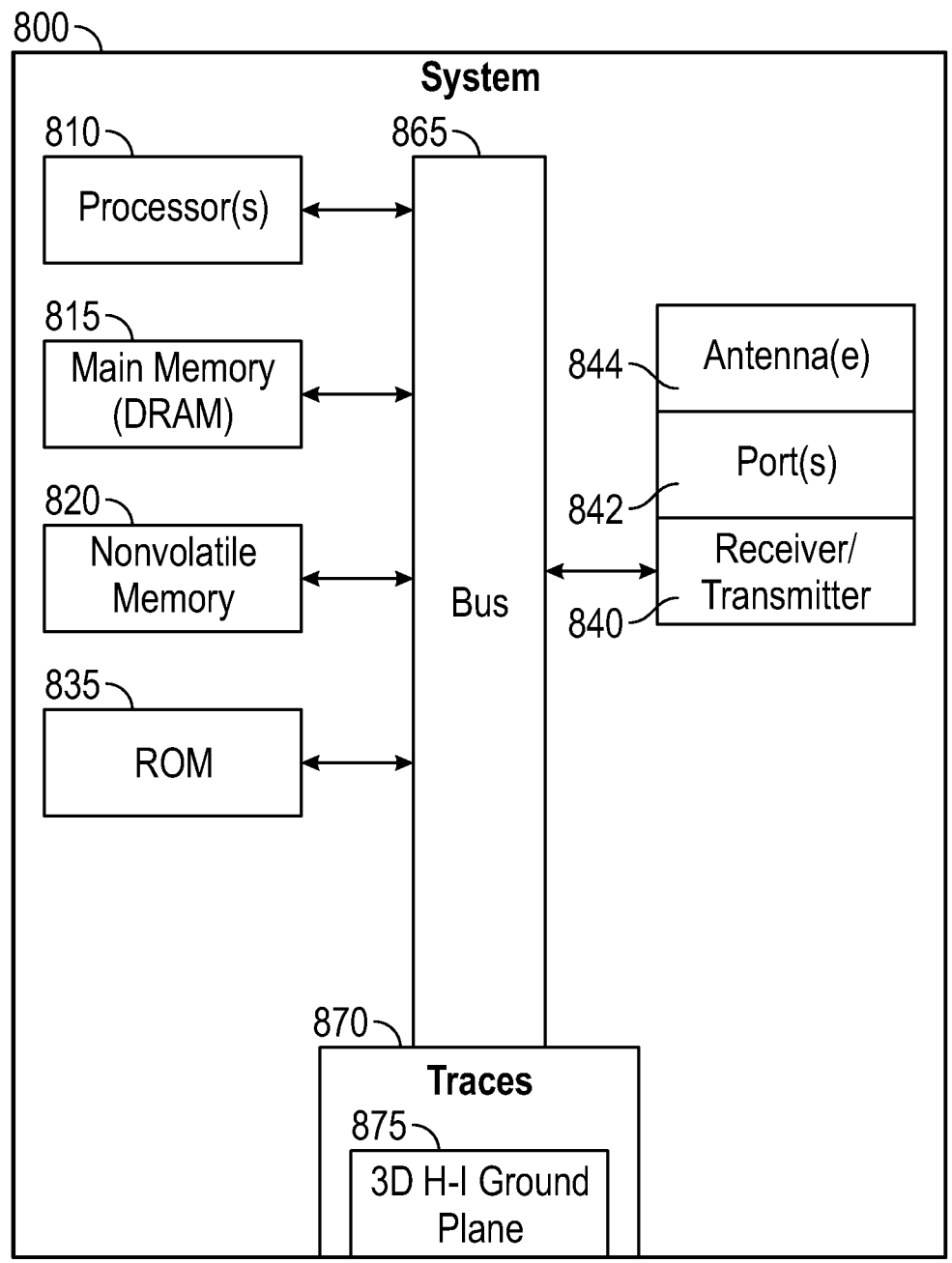
FIG. 8 is an illustration of a system including a printed circuit board with 3D inductance ground plane according to an embodiment.

FIG. 8 is an illustration of a system including a printed circuit board with 3D inductance ground plane according to an embodiment. In this illustration, certain standard and well-known components that are not germane to the present description are not shown.

In some embodiments, a system 800 includes a bus 865, the bus being a communication means for transmission of data. The bus 865 is illustrated as a single bus for simplicity, but may represent multiple different interconnects or buses and the component connections to such interconnects or buses may vary. The bus 865 shown in FIG. 8 is an abstraction that represents any one or more separate physical buses, point-to-point connections, or both connected by appropriate bridges, adapters, or controllers.

In particular, the bus 865 includes traces 870 for the carrying of signals, wherein at least a pair of traces includes a 3D high-inductance ground plane 875. The 3D high-inductance ground plane 875 may be as illustrated in FIGS. 3A to 3D.

In some embodiments, the system 800 further includes a processing means such as one or more processors 810 coupled to the bus 865. The processors 810 may comprise one or more physical processors and one or more logical processors. In some embodiments, the processors may include one or more general-purpose processors or special-processor processors.

In some embodiments, the system 800 further comprises a random access memory (RAM) or other dynamic storage device or element as a main memory 815 for storing information and instructions to be executed by the processors 810. Main memory 815 may include, but is not limited to, dynamic random access memory (DRAM).

The system 800 also may comprise a non-volatile memory 820; and a read only memory (ROM) 835 or other static storage device for storing static information and instructions for the processors 810.

In some embodiments, the system 800 includes one or more transmitters or receivers 840 coupled to the bus 865. In some embodiments, the system 800 may include one or more antennae 844 (internally or externally), such as dipole or monopole antennae, for the transmission and reception of data via wireless communication using a wireless transmitter, receiver, or both, and one or more ports 842 for the transmission and reception of data via wired communications. Wireless communication includes, but is not limited to, Wi-Fi, Bluetooth™, near field communication, and other wireless communication standards.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a printed circuit board includes a first signal trace and a second signal trace on a first layer, wherein the first signal trace and second signal trace are non-intersecting; a second layer below the first layer; a third layer below the second layer; and a three-dimensional (3D) ground plane, the 3D ground plane including a first plurality of segments on the third layer, a second plurality of segments on the second layer, and a plurality of metal vias to connect the first plurality of segments and the second plurality of segments in the 3D ground plane.

In some embodiments, each segment of the first plurality of segments is separated from a next segment on the third layer by a gap, and wherein each segment of the second plurality of segments is separated from a next segment on the second layer by a gap.

In some embodiments, the first plurality of segments and the second plurality of segments are connected alternately by the metal vias between the second layer and the third layer.

In some embodiments, the first plurality of segments and the second plurality of segments are connected by the metal vias to generate a square wave path along the second layer and the third layer.

In some embodiments, a first end of a first segment of the first plurality of segments is connected with a first segment of the second plurality of segments by a first metal via, and a second end of the first segment of the first plurality of segments is connected with a second segment of the second plurality segments by a second metal via.

In some embodiments, the 3D ground plane is associated with a reference voltage. In some embodiments, the reference voltage is one of a ground voltage or a power voltage of the board.

In some embodiments, a method for fabrication of a circuit board includes creating a first layer on a circuit board, creating the first layer including etching a first plurality of segments of a three-dimensional (3D) ground plane; application of a first laminate layer; creating a plurality of metal vias through the first laminate layer to connect with the first layer of segments; creating a second layer on a circuit board, creating the second layer including etching a second plurality of segments, the second plurality of segments connecting to the first plurality of segments by the plurality of metal vias; application of a second laminate layer; and etching a first signal trace and a second signal trace on a third layer of the circuit board, the first signal trace being on a first side of the 3D ground plane and the second signal trace on a second side of the 3D ground plane.

In some embodiments, each segment of the first plurality of segments is separated from a next segment on the first layer by a gap, and wherein each segment of the second plurality of segments is separated from a next segment on the second layer by a gap.

In some embodiments, creating the second plurality of segments includes connecting the first plurality of segments and the second plurality of segments alternately by the plurality of metal vias between the first layer and the second layer.

In some embodiments, the first plurality of segments and the second plurality of segments are connected by the metal vias to generate a square wave path along the first layer and the second layer.

In some embodiments, a first end of a first segment of the first plurality of segments is connected with a first segment of the second plurality of segments by a first metal via, and a second end of the first segment of the first plurality of segments is connected with a second segment of the second plurality of segments by a second metal via.

In some embodiments, the method further includes associating the 3D ground plane with a reference voltage. In some embodiments, the reference voltage is one of a ground voltage or a power voltage of the board.

In some embodiments, a system includes a processing element for the processing of data; a memory for the storage of data; a transmitter or receiver and one or more antennae for the transmission or reception of data; and a printed circuit board including a first signal trace and a second signal trace on a first layer, wherein the first signal trace and second signal trace are non-intersecting; a second layer below the first layer; a third layer below the second layer; and a three-dimensional (3D) ground plane, the 3D ground plane including a first plurality of segments on the third layer, a second plurality of segments on the second layer, and a plurality of metal vias to connect the first plurality of segments and the second plurality of segments in the 3D ground plane.

In some embodiments, each segment of the first plurality of segments is separated from a next segment on the third layer by a gap, and wherein each segment of the second plurality of segments is separated from a next segment on the second layer by a gap.

In some embodiments, the first plurality of segments and the second plurality of segments are connected alternately by the metal vias between the second layer and the third layer.

In some embodiments, the first plurality of segments and the second plurality of segments are connected by the metal vias to generate a square wave path along the second layer and the third layer.

In some embodiments, a first end of a first segment of the first plurality of segments is connected with a first segment of the second plurality of segments by a first metal via, and a second end of the first segment of the first plurality of segments is connected with a second segment of the second plurality segments by a second metal via.

In some embodiments, the 3D ground plane is associated with a reference voltage. In some embodiments, reference voltage is one of a ground voltage or a power voltage of the board.

What is claimed is:

1. A printed circuit board comprising:
a first signal trace and a second signal trace on a first layer, wherein the first signal trace and second signal trace are non-intersecting, and the first signal trace and second signal trace are along a direction, and wherein the first signal trace is not coupled to the second signal trace;
a second layer below the first layer;
a third layer below the second layer; and
a three-dimensional (3D) ground plane, the 3D ground plane including:
a first plurality of segments on the third layer, a second plurality of segments on the second layer, and a plurality of metal vias to connect the first plurality of segments and the second plurality of segments in the 3D ground plane, wherein the first plurality of segments and the second plurality of segments are along the direction, and wherein the first plurality of segments and the second plurality of segments are between and non-overlapping with the first signal trace and the second signal trace from a plan view perspective.

2. The board of claim 1, wherein each segment of the first plurality of segments is separated from a next segment on the third layer by a gap, and wherein each segment of the second plurality of segments is separated from a next segment on the second layer by a gap.

3. The board of claim 1, wherein the first plurality of segments and the second plurality of segments are connected alternately by the metal vias between the second layer and the third layer.

4. The board of claim 3, wherein the first plurality of segments and the second plurality of segments are connected by the metal vias to generate a square wave path along the second layer and the third layer.

5. The board of claim 3, wherein a first end of a first segment of the first plurality of segments is connected with a first segment of the second plurality of segments by a first metal via, and a second end of the first segment of the first plurality of segments is connected with a second segment of the second plurality segments by a second metal via.

6. The board of claim 1, wherein the 3D ground plane is associated with a reference voltage.

7. The board of claim 6, wherein the reference voltage is one of a ground voltage or a power voltage of the board.

8. A system comprising:
a processing element for the processing of data;
a memory for the storage of data;
a transmitter or receiver and one or more antennae for the transmission or reception of data; and
a printed circuit board including:
a first signal trace and a second signal trace on a first layer, wherein the first signal trace and second signal trace are non-intersecting, and the first signal trace and second signal trace are along a direction, and wherein the first signal trace is not coupled to the second signal trace;

a second layer below the first layer;

a third layer below the second layer; and a three-dimensional (3D) ground plane, the 3D ground plane including:

a first plurality of segments on the third layer, a second plurality of segments on the second layer, and a plurality of metal vias to connect the first plurality of segments and the second plurality of segments in the 3D ground plane, wherein the first plurality of segments and the second plurality of segments are along the direction, and wherein the first plurality of segments and the second plurality of segments are between and non-overlapping with the first signal trace and the second signal trace from a plan view perspective.

9. The system of claim 8, wherein each segment of the first plurality of segments is separated from a next segment on the third layer by a gap, and wherein each segment of the second plurality of segments is separated from a next segment on the second layer by a gap.

10. The system of claim 8, wherein the first plurality of segments and the second plurality of segments are connected alternately by the metal vias between the second layer and the third layer.

11. The system of claim 8, wherein the first plurality of segments and the second plurality of segments are connected by the metal vias to generate a square wave path along the second layer and the third layer.

12. The system of claim 8, wherein a first end of a first segment of the first plurality of segments is connected with a first segment of the second plurality of segments by a first metal via, and a second end of the first segment of the first plurality of segments is connected with a second segment of the second plurality segments by a second metal via.

13. The system of claim 8, wherein the 3D ground plane is associated with a reference voltage.

14. The system of claim 13, wherein the reference voltage is one of a ground voltage or a power voltage of the board.

* * * * *